United States Patent
Kim et al.

(10) Patent No.: US 7,589,376 B2
(45) Date of Patent: Sep. 15, 2009

(54) ELECTRICALLY ERASABLE PROGRAMMABLE READ-ONLY MEMORY (EEPROM) DEVICE AND METHODS OF FABRICATING THE SAME

(75) Inventors: Jae-Hwang Kim, Yongin-si (KR); Seung-Beom Yoon, Suwon-si (KR); Kwang-Wook Koh, Seoul (KR); Chang-Hun Lee, Suwon-si (KR); Sung-Ho Kim, Osan-si (KR); Sung-Chul Park, Seoul (KR); Ju-Ri Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/199,307

(22) Filed: Aug. 27, 2008

(65) Prior Publication Data

US 2008/0315289 A1 Dec. 25, 2008

Related U.S. Application Data

(62) Division of application No. 11/242,209, filed on Oct. 3, 2005, now Pat. No. 7,432,159.

(30) Foreign Application Priority Data

Oct. 13, 2004 (KR) ................ 2004-81861

(51) Int. Cl.
*H01L 29/94* (2006.01)

(52) U.S. Cl. ...................... 257/321; 257/314

(58) Field of Classification Search ................ 257/314, 257/321
See application file for complete search history.

(56) References Cited

U.S. PATENT DOCUMENTS

| | | |
|---|---|---|
| 5,455,792 A | 10/1995 | Yi |
| 6,642,103 B2 | 11/2003 | Wils et al. |
| 6,680,225 B2 | 1/2004 | Miyagi |
| 2002/0110985 A1 | 8/2002 | Tseng |

FOREIGN PATENT DOCUMENTS

| | | |
|---|---|---|
| KR | 1020000038867 | 7/2000 |
| KR | 1020020002718 | 1/2002 |

*Primary Examiner*—Douglas M Menz
(74) *Attorney, Agent, or Firm*—F. Chau & Associates, LLC

(57) ABSTRACT

An EEPROM device includes a device isolation layer disposed at a predetermined region of a semiconductor substrate to define active regions, a pair of control gates crossing the device isolation layers and an active region, a pair of selection gates interposed between the control gates to cross the device isolation layers and the active region and a floating gate and an intergate dielectric pattern stacked sequentially between the control gates and the active region The EEPROM device further includes a gate insulation layer of a memory transistor interposed between the floating gate and the active region and a tunnel insulation layer thinner than the gate insulation layer of the memory transistor and a gate insulation layer of a selection transistor interposed between the selection gates and the active region. The tunnel insulation layer is aligned at one side adjacent to the floating gate.

7 Claims, 10 Drawing Sheets

ELECTRICALLY ERASABLE PROGRAMMABLE READ-ONLY MEMORY (EEPROM) DEVICE AND METHODS OF FABRICATING THE SAME

CROSS-REFERENCE TO RELATED APPLICATIONS

This application is a divisional of U.S. patent application Ser. No. 11/242,209, filed on Oct. 3, 2005 now U.S. Pat. No. 7,432,159 which in turn claims priority under 35 U.S.C. § 119 to Korean Patent Application 2004-81861 filed on Oct. 3, 2004, the entire disclosures of which are each hereby incorporated by reference here in their entireties.

BACKGROUND OF THE INVENTION

The present invention relates to semiconductor devices and methods of fabricating the same and, more particularly, to an electrically erasable and programmable read-only memory (EEPROM) device and methods of fabricating the same.

In a semiconductor device, EEPROM cells have the non-volatile characteristic of being able to retain their stored data even though their power supplies are interrupted. Typically, each of the EEPROM cells has a floating gate acting as a data storage. The floating gate is electrically isolated and stores charges therein. The data of an EEPROM cell is classified into logic "1" and logic "0" according to the amount of the charges stored in the floating gate.

FIG. 1A and FIG. 1B are a plan view and a cross-sectional view for illustrating the configuration of a conventional EEPROM.

As illustrated in FIG. 1A and FIG. 1B, a device isolation layer 15 is disposed to define an active region A in a predetermined region of a semiconductor substrate 10. A control gate CG and a selection gates SG are disposed on the active region A and the device isolation layer 15 to act as a control gate electrode of a memory transistor and a gate electrode of a selection transistor, respectively. A floating gate FG is interposed between the control gate CG and the active region A to act as a charge storage layer. An intergate dielectric 50 is interposed between the floating gate FG and the control gate CG to electrically isolate the floating gate FG.

A gate oxide layer 30 and a tunnel oxide layer 20 are interposed between the floating gate FG and the active region A. The tunnel oxide layer 20 is surrounded by the gate oxide layer 30, as illustrated in FIG. 1A, and is thinner than the gate oxide layer 30, as illustrated in FIG. 1B.

In addition, a lower conductive pattern 60 electrically connected to the selection gates SG is interposed between the selection gates SG and the active region A. For this, the intergate dielectric 50 is not formed between the selection gates SG and the lower conductive pattern 60. Rather, the gate oxide layer 30 is interposed between the lower conductive pattern 60 and the active region A.

A tunnel impurity region 40 is interposed between the control gate CG and the selection gates SG. The tunnel impurity region 40 extends downwardly toward the tunnel oxide layer 20. A source region S spaced apart from the tunnel impurity region 40 is disposed at one side of the control gate CG, and a drain region D spaced apart from the tunnel impurity region 40 is disposed at one side of the selection gates SG.

According to conventional methods for forming an EEPROM, a control gate CG and a floating gate FG are formed using a self-aligned etch process. In order to prevent the tunnel oxide layer 20 from being damaged by misalignment during the self-aligned etch process, the floating gate FG has a margin of a predetermined width W from the edge of the tunnel oxide layer 20. Considering that damage to the tunnel oxide layer 20 has an effect on the characteristics of an EEPROM, a space margin should be provided between the floating gate FG and the tunnel oxide layer 20. However, space margins cause difficulty in developing higher-integrated EEPROM.

SUMMARY OF THE INVENTION

Exemplary embodiments of the present invention are directed to an EEPROM and methods of fabricating the same. In an exemplary embodiment, the method includes forming mold patterns on a predetermined region of a semiconductor substrate, forming a tunnel insulation layer on a resultant structure where the mold patterns are formed, forming a tunnel spacer on sidewalls of the mold patterns to cover a top surface and a sidewall of the tunnel insulation layer and forming a gate insulation layer on the semiconductor substrate between the tunnel spacers. The gate insulation layer is thicker than the tunnel insulation layer. The method further includes removing the tunnel spacers to expose the tunnel insulation layer, forming a first conductive layer on the resultant structure where the tunnel spacer has been removed, planarizing the first conductive layer down to a top surface of the mold pattern to form a first conductive pattern filling a gap region between the mold patterns, removing the exposed mold patterns, forming an intergate dielectric and a second conductive layer on the resultant structure where the mold pattern has been removed and patterning the second conductive layer, the intergate dielectric, and the first conductive pattern to form gate electrodes of a memory transistor and a selection transistor.

In another exemplary embodiment, the EEPROM device includes a device isolation layer disposed at a predetermined region of a semiconductor substrate to define active regions, a pair of control gates crossing over the device isolation layers and an active region, a pair of selection gates interposed between the control gates to cross the device isolation layers and the active region and a floating gate and an intergate dielectric pattern stacked sequentially between the control gates and the active region. The EEPROM device further includes a gate insulation layer and a tunnel insulation layer of a memory transistor interposed between the floating gate and the active region. The tunnel insulation layer is thinner than the gate insulation layer. In addition, the EEPROM device further includes a gate insulation layer of a selection transistor interposed between the selection gates and the active region. The tunnel insulation layer is aligned at one side adjacent to the floating gate.

BRIEF DESCRIPTION OF THE DRAWINGS

FIG. 2A through FIG. 10A are plan views for illustrating a method of fabricating an EEPROM in accordance with an exemplary embodiment of the present invention.

FIG. 2B through FIG. 10B are cross-sectional views for illustrating a method of fabricating an EEPROM in accordance with an exemplary embodiment of the present invention.

DETAILED DESCRIPTION OF PREFERRED EMBODIMENTS

Figure 1A:
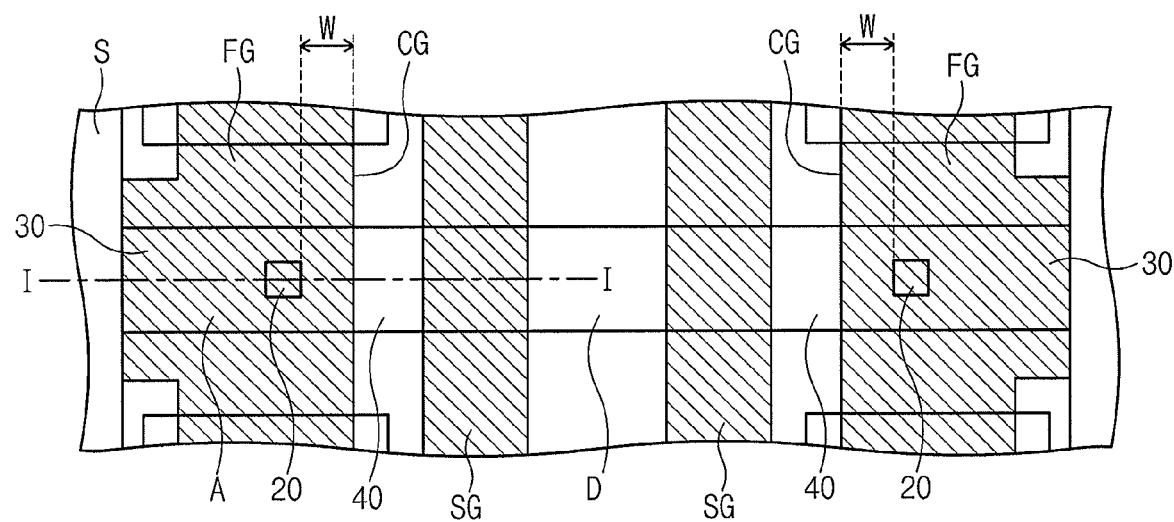
FIG. 1A and FIG. 1B are a top plan view and a cross-sectional view of a conventional EEPROM, respectively.
Figure 1B:
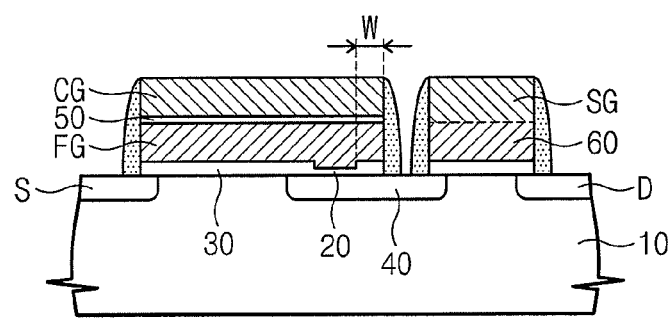

The exemplary embodiments of the present invention will now be described more fully hereinafter with reference to the accompanying drawings, in which preferred embodiments of the invention are shown. This invention may, however, be embodied in different forms and should not be construed as limited to the embodiments set forth herein. In the drawings, the thickness of layers and regions are exaggerated for clarity. It will also be understood that when a layer is referred to as being "on" another layer or substrate, it can be directly on the other layer or substrate, or intervening layers may also be present.

FIG. 2A to FIG. 10A are plan views illustrating a method of fabricating an EEPROM according to an embodiment of the present invention, and FIG. 2B through FIG. 10B are cross-sectional views taken along lines II-II' of FIG. 2A through FIG. 10A, respectively.

Figure 2A:
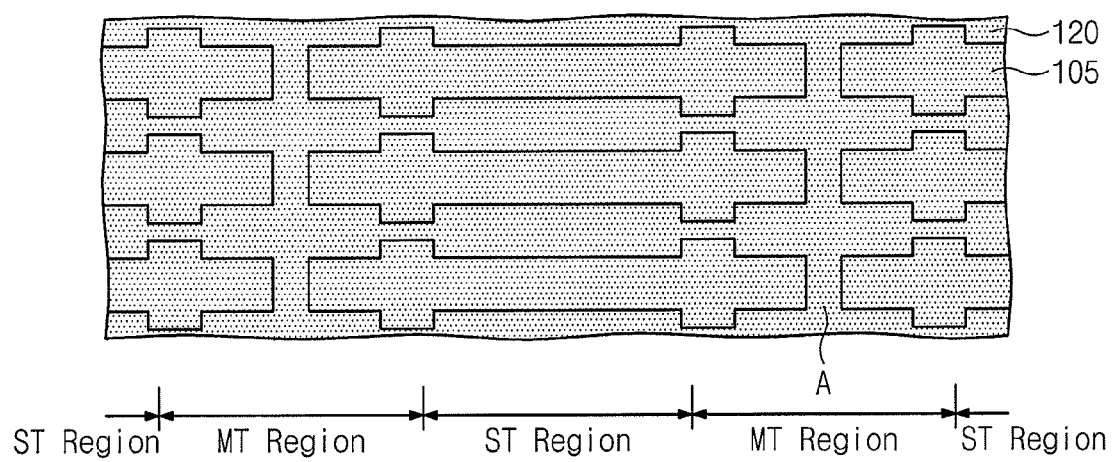
Figure 2B:
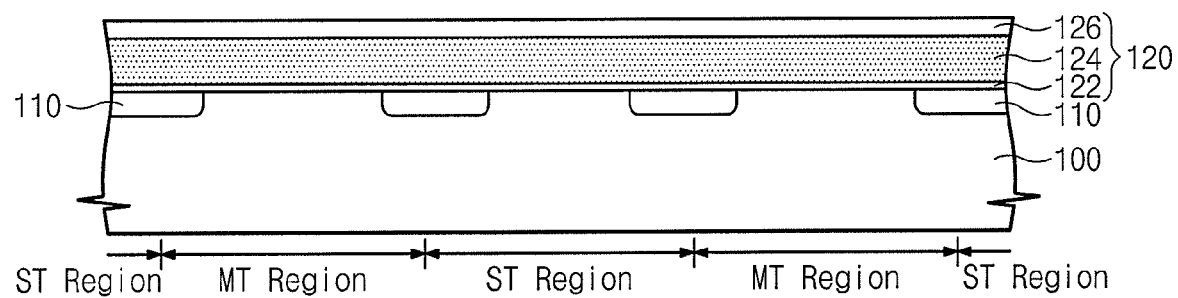

As illustrated in FIG. 2A and FIG. 2B, device isolation patterns 105 are formed in a semiconductor substrate 100 to define active regions A. The device isolation patterns 105 may include insulation layers filling trenches formed using a trench etch. The semiconductor substrate 100 may be divided into a memory transistor region MT and a selection transistor region ST.

Figure 3A:
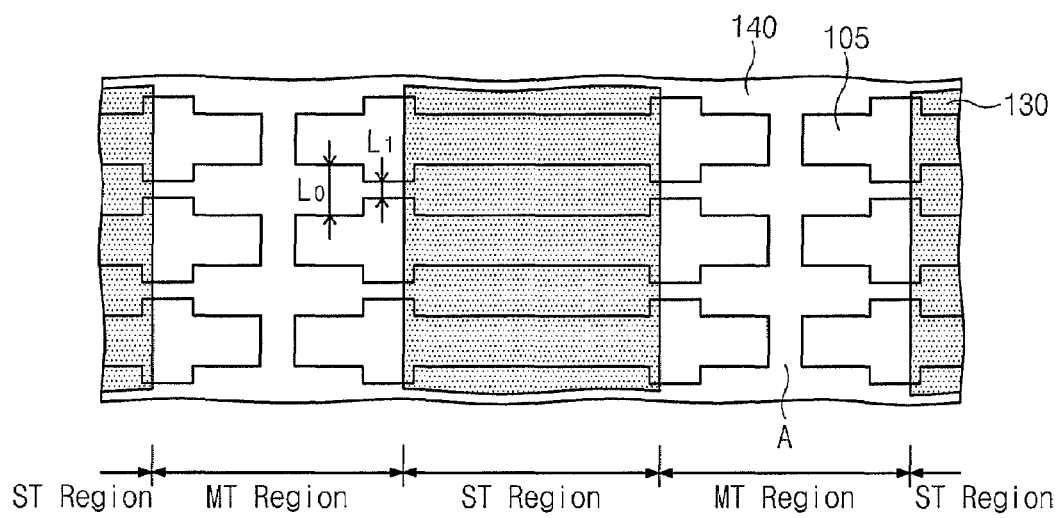

A plurality of tunnel impurity regions 110 are formed in the semiconductor substrate 100. Formation of the tunnel impurity regions 110 may be achieved using a predetermined ion implantation. The tunnel impurity regions 110 are disposed at a boundary between the memory transistor region MT and the selection transistor region ST. Moreover, as shown in FIG. 3A, the width $L_1$ of the active region A at a boundary between the memory transistor region MT and the selection transistor region ST is smaller than the width $L_0$ at other portions of the active regions A. Also, due to the width of the narrower active region A provided at the boundary mentioned above, a tunnel area is reduced in subsequent processes to enhance program/erase efficiency, as will be described in further detail below.

In addition, a mold layer 120 is formed on an entire surface of a resultant structure where the tunnel impurity regions 110 are formed. According to an embodiment of the present invention, the mold layer 120 includes first, second, and third mold layers 122, 124 and 126 which are stacked in the order named. The first mold layer 122 is made of silicon oxide using thermal oxidation or chemical vapor deposition (CVD), and the second mold layer 124 is made of silicon nitride using CVD. The third mold layer 126 is made of silicon oxide using CVD.

Figure 3B:
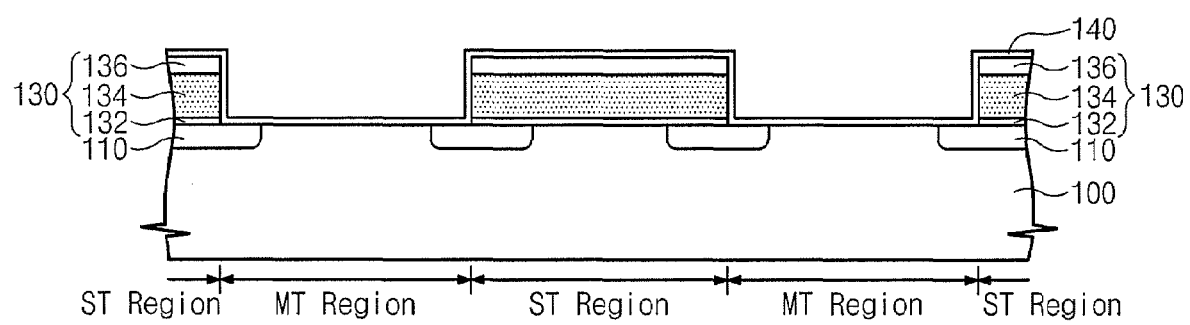

As illustrated in FIG. 3A and FIG. 3B, the mold layer 120 is patterned to form mold patterns 130 defining the memory transistor region MT and the selection transistor region ST. The mold pattern 130 includes first, second, and third mold patterns 132, 134 and 136 which are stacked in the order named. The mold pattern 130 is disposed on an upper portion of the selection transistor region ST to expose a top surface of the memory transistor region MT.

A tunnel insulation layer 140 is formed on a semiconductor substrate including the mold patterns 130 to cover a top surface of the exposed memory transistor region MT. The tunnel insulation layer is made of silicon oxide using thermal oxidation, CVD or atomic layer deposition (ALD). In a case where the tunnel oxide layer 140 is formed using the CVD, an additional annealing process may be performed.

Figure 4A:
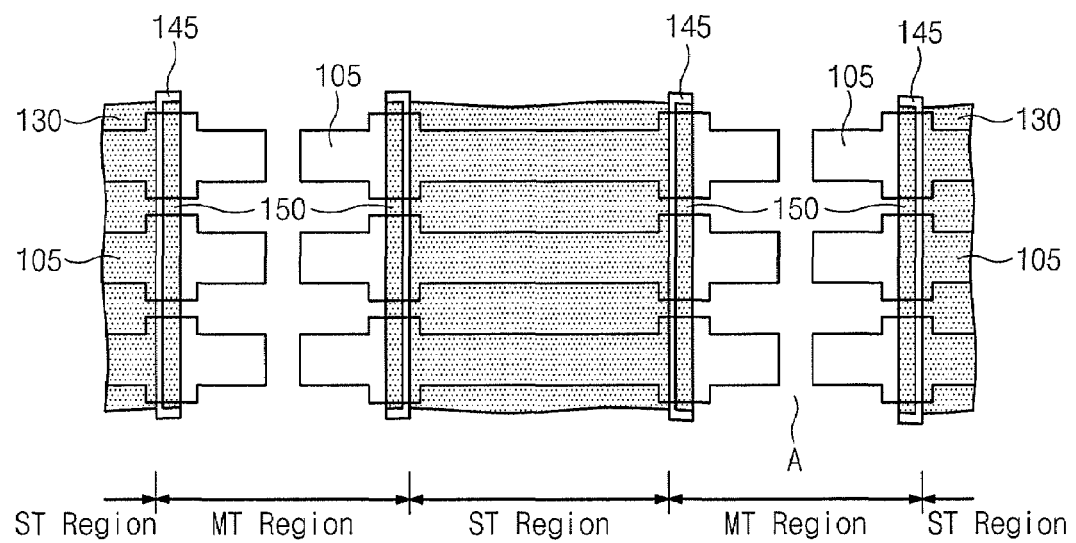
Figure 4B:
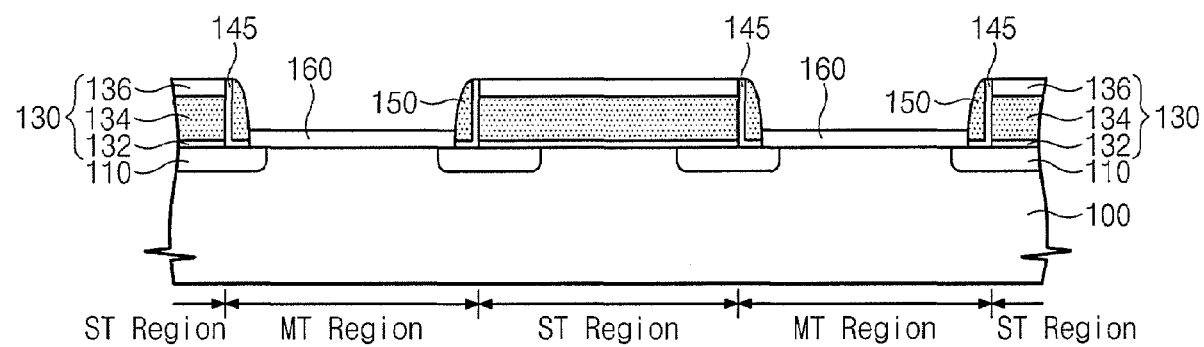

As illustrated in FIG. 4A and FIG. 4B, an insulation layer is formed on the tunnel oxide layer 140 and anisotropically etched to form a tunnel spacer 150 on a sidewall of the mold pattern 130. Formation of the tunnel spacer 150 further includes etching the tunnel insulation layer 140 to form a tunnel insulation pattern 145 exposing an upper portion of the semiconductor substrate 100 at the memory transistor region MT. Accordingly, the tunnel insulting layer pattern 145 is interposed between the tunnel spacer 150 and the semiconductor substrate 100. In the case where the tunnel insulation layer 140 is formed using CVD, the tunnel insulation layer 140 covering an upper portion of the mold pattern 130 is also etched and thus the tunnel insulation pattern 145 is interposed between the tunnel spacer 150 and the mold pattern 130.

The insulation layer and the tunnel spacer 150 are made of materials having an etch selectivity with respect to the tunnel insulation layer 140. That is, the tunnel spacer 150 is made of a material reducing an etching of the tunnel insulation layer 140 while being removable. Further, the tunnel spacer 150 is made of a material having an etch selectivity with respect to silicon such as the semiconductor substrate 100. According to an embodiment of the present invention, the tunnel spacer 150 is made of silicon nitride that is selectively removable with respect to silicon oxide and silicon.

A gate insulation layer 160 is formed on the exposed semiconductor substrate 100 of the memory transistor region MT and disposed on the semiconductor substrate 100 between the tunnel spacers 150. The gate insulation layer 160 is thicker than the tunnel insulation pattern 145 to enhance an efficiency of program/erase operations of an EEPROM. Further, the gate insulation layer 160 is made of silicon oxide using thermal oxidation.

Figure 5A:
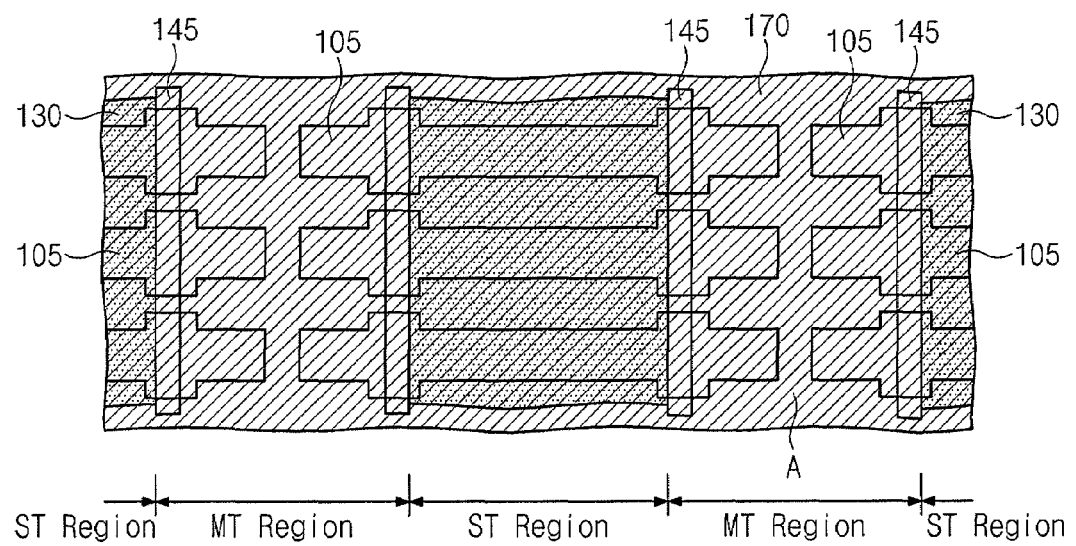
Figure 5B:
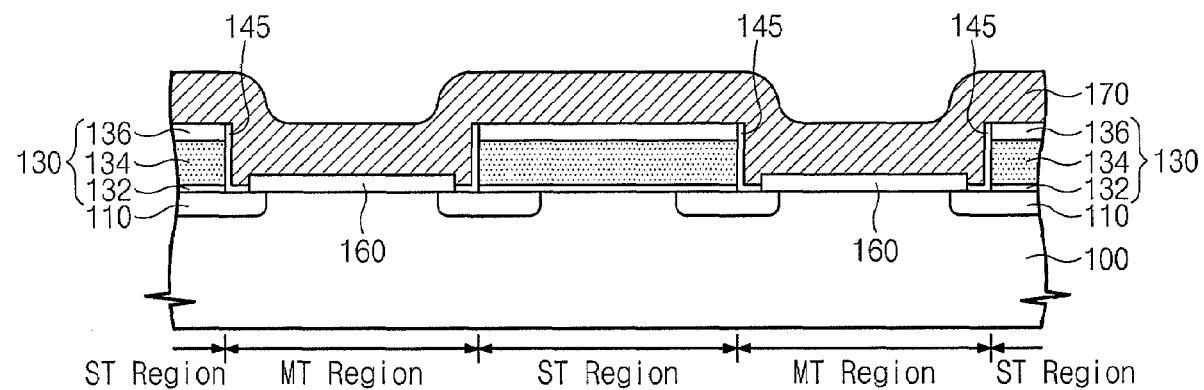

As illustrated in FIG. 5A and FIG. 5B, the tunnel spacers 150 are removed using an etching recipe having an etch selectivity with respect to the gate insulation layer 160 and the tunnel insulation layer 140. Removal of the tunnel spacers 150 is done using an etchant containing phosphoric acid.

A first conductive layer 170 is formed on the resultant structure where the tunnel spacers 150 are removed. The first conductive layer 170 acts as a floating gate electrode of a memory transistor. For this reason, the first conductive layer 170 is made of polysilicon. The first conductive layer 170 is formed to have a thickness which is sufficient to fill a space between the mold patterns 130 and cover top surfaces of the tunnel insulation layer 140 and the gate insulation layer 160.

It is also noted that when removing the tunnel spacer 150, a tunnel insulation layer may also be re-formed using thermal oxidation or CVD. In this case, to maintain a difference between the thicknesses of the gate insulation layer 160 and the tunnel insulation layer 140, the gate insulation layer 160 is not completely removed by controlling an etch time or the like when the tunnel insulation layer 140 is removed.

Figure 6A:
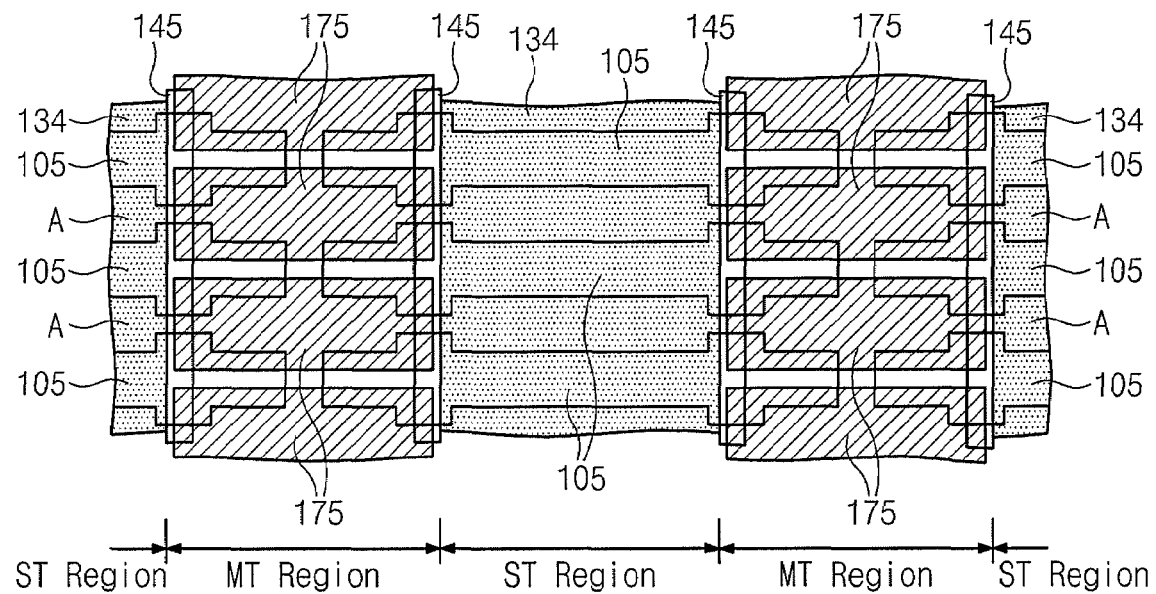
Figure 6B:
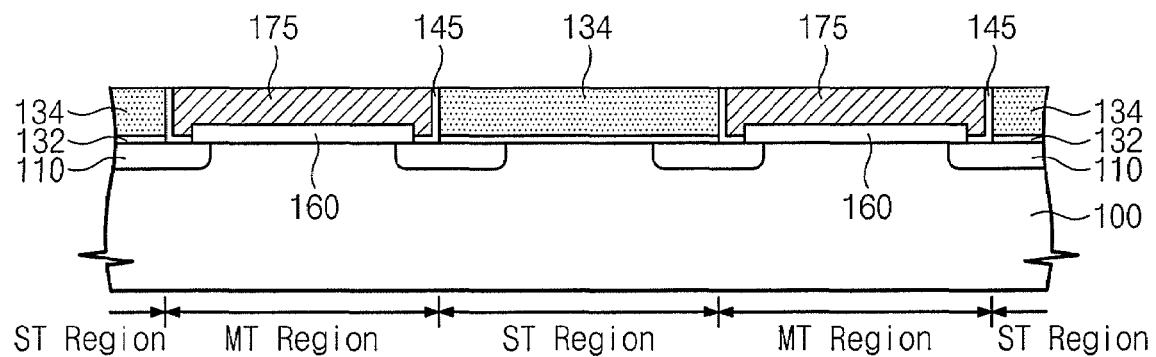

As illustrated in FIG. 6A and FIG. 6B, the first conductive layer 170 is planarized down to a top surface of the mold pattern 130 to form the first conductive pattern 175. Planarization of the first conductive layer 170 is done using chemical mechanical polishing (CMP).

According to an embodiment of the present invention, the planarization is performed down to a top surface of the second mold pattern 134 to enhance etch uniformity. As a result, the first conductive pattern 175 covers top surfaces of the tunnel insulation layer 140 and the gate insulation layer 160-175 while filling a space between the second mold patterns 134.

Figure 7A:
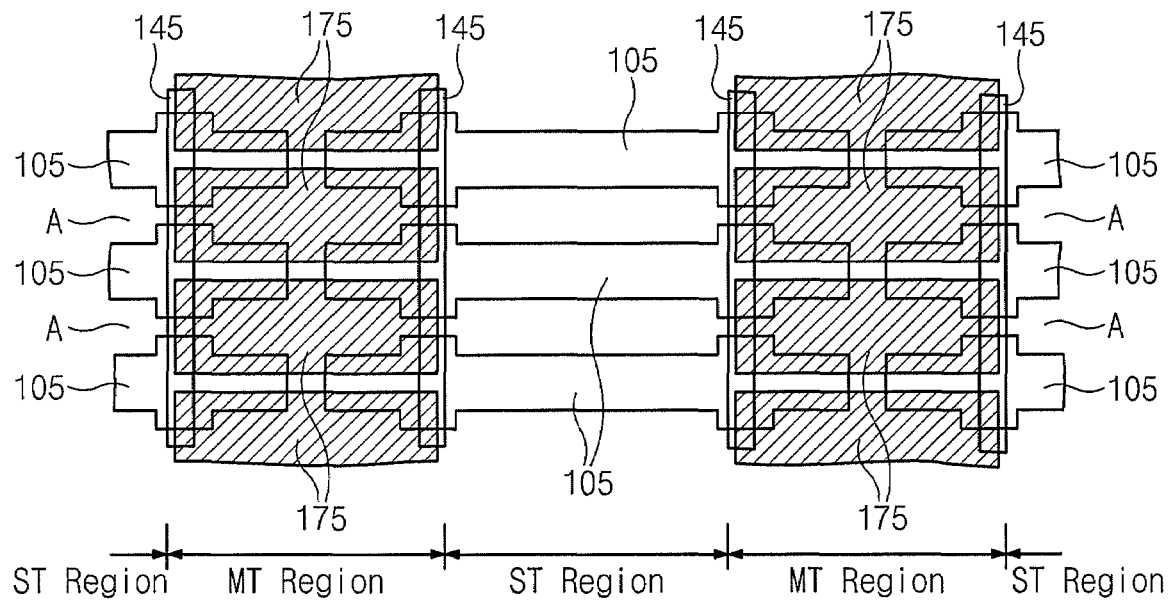
Figure 7B:
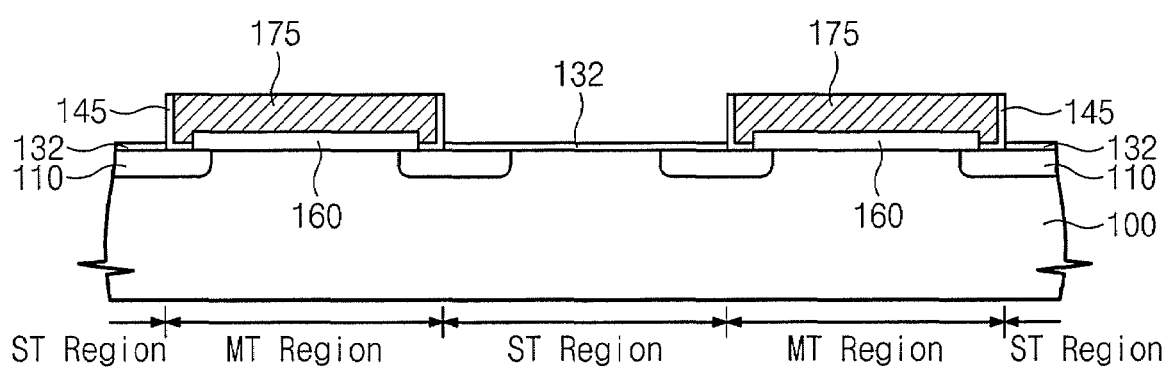

As illustrated in FIG. 7A and FIG. 7B, the exposed second mold pattern 134 is removed. Removal of the exposed second mold pattern 134 is done using an etch recipe having an etch selectivity with respect to the first conductive pattern 175 and the tunnel insulation pattern 145. Namely, the second mold pattern 134 is selectively removed without causing etch damage to the first conductive pattern 175 and the tunnel insulation pattern 145.

As a result, the first mold pattern 132 remains on the semiconductor substrate 100 at the selective transistor region ST. According to an embodiment of the present invention, the first mold pattern 132 acts as an etch-stop layer during the removal of the second mold pattern 134. According to another embodiment of the present invention, the remaining first mold pattern 132 may also be removed.

Figure 8A:
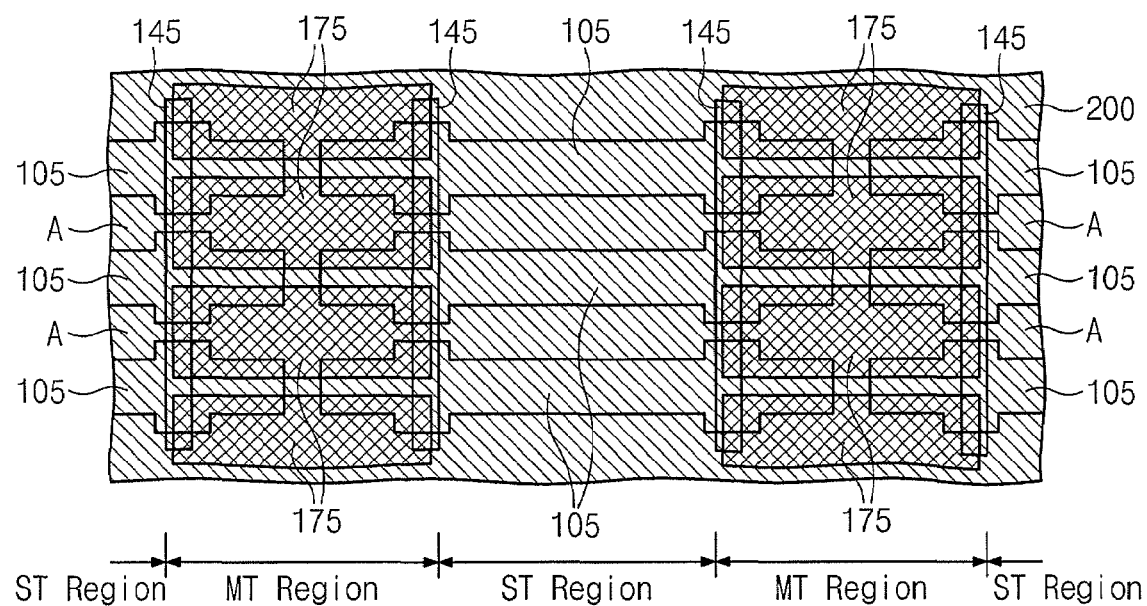
Figure 8B:
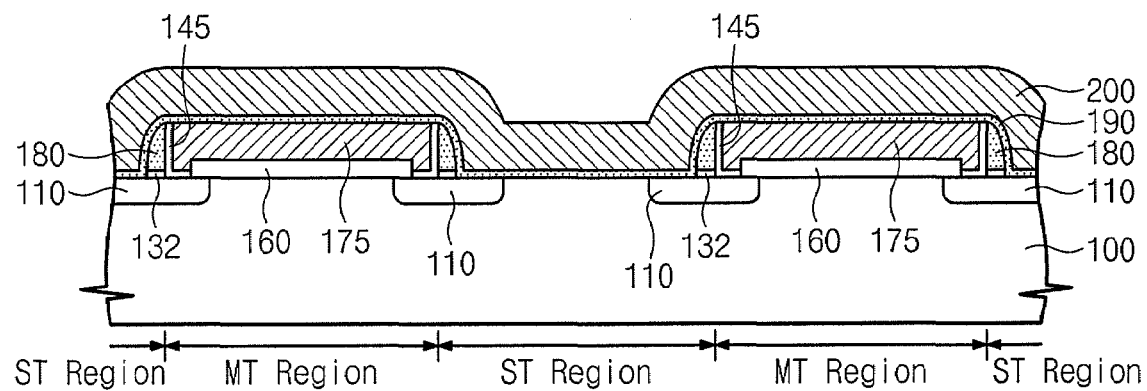

As illustrated in FIG. 8A and FIG. 8B, a sidewall spacer 180 is formed on the first mold pattern 132 disposed at opposite sides adjacent to the first conductive pattern 175. The sidewall spacer 180 protects the first conductive pattern 175 and the tunnel insulation pattern 145 from etch damage that may arise in a subsequent gate patterning process. An intergate dielectric 190 and the second conductive layer 200 are formed on a resultant structure where the sidewall spacer 180 is formed.

Formation of the sidewall spacer 180 includes forming a spacer insulation layer on the resultant structure having the first conductive layer 170 and anisotropically etching the spacer insulation layer. The formation of the spacer insulation layer is done using CVD. According to an embodiment of the present invention, the spacer insulation layer and the sidewall spacer 180 are made of silicon nitride. The formation of the sidewall spacer 180 may further include etching the first mold pattern 132 to expose the substrate 100 between the sidewall spacers 180.

The intergate dielectric 190 may be made of at least two materials selected from silicon nitride and silicon oxide. For example, the intergate dielectric 190 may be made of silicon nitride and silicon oxide which are stacked in the order named or silicon oxide, silicon nitride, and silicon oxide which are stacked in order the named. According to an embodiment of the present invention, the intergate dielectric 190 covers a top surface of the semiconductor substrate 100 at the selection transistor region ST. The second conductive layer 200 is made of polysilicon or silicide.

Figure 9A:
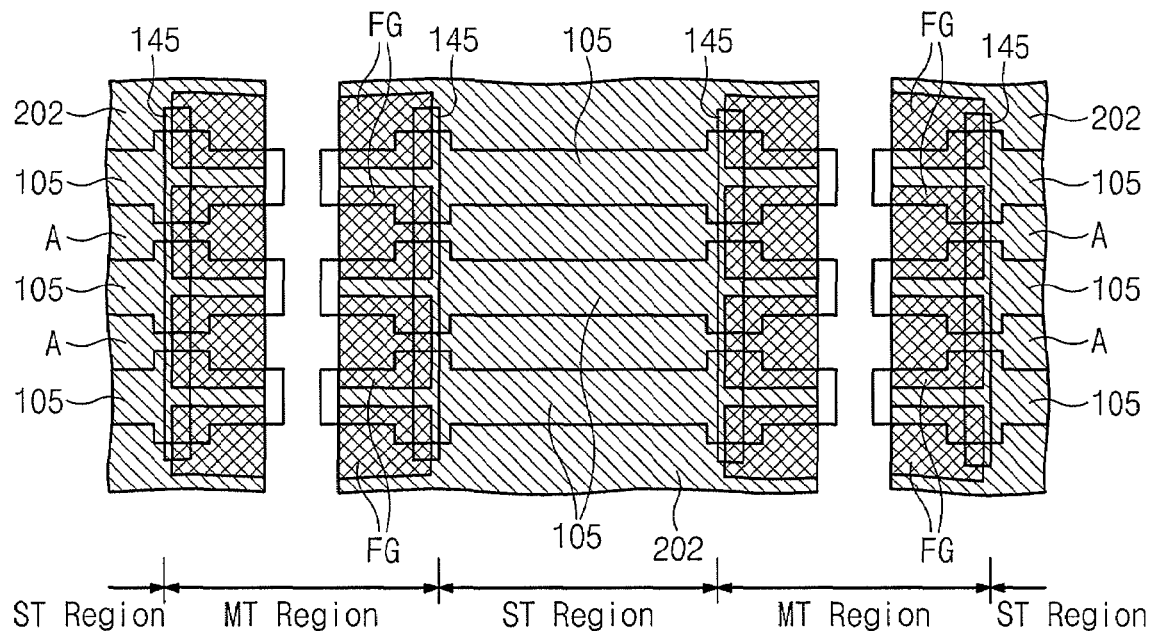
Figure 9B:
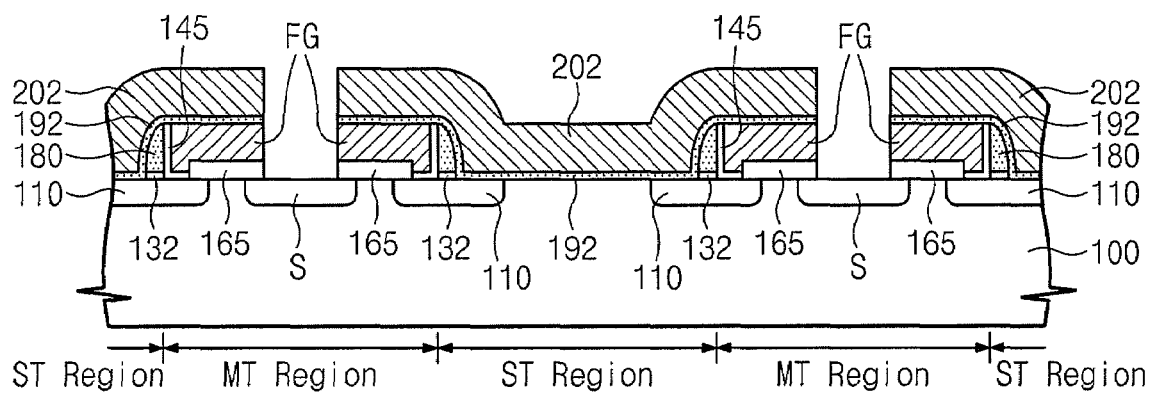

As illustrated in FIG. 9A and FIG. 9B, the second conductive layer 200, the intergate dielectric 190, and the first conductive pattern 175 are patterned to form the second conductive pattern 202, the intergate dielectric pattern 192, and the floating gate FG, respectively. The patterns 202, 192, and FG are formed to expose a top surface of the semiconductor substrate 100 at the memory transistor region MT. Source regions S are formed on the exposed semiconductor substrate 100 using predetermined ion implantation. As a result, the floating gate FG is formed throughout the source regions S and the tunnel impurity region 110 to act as a charge storage layer of a memory transistor.

Figure 10A:
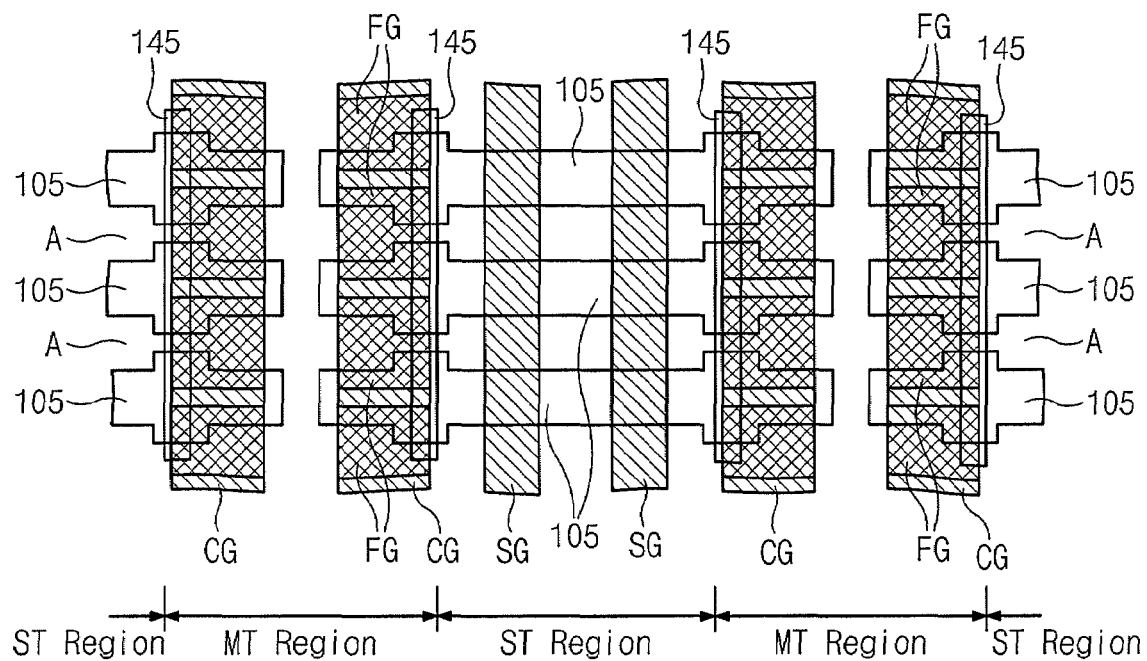
Figure 10B:
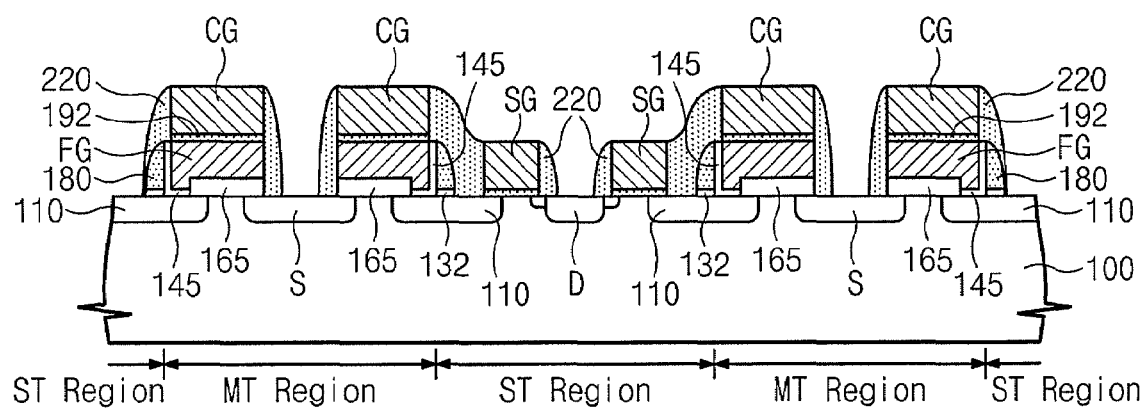

As illustrated in FIG. 10A and FIG. 10B, the second conductive pattern 202 is re-patterned to form control gates CG which acts as gate electrodes of memory transistors and selection gates SG which acts as gate electrodes of selection transistors. Drain regions D are formed in the semiconductor substrate between the selection gates SG.

According to an embodiment of the present invention, following formation of the selection gates SG, an insulation layer is deposited and anisotropically etched to form gate spacers 220 on sidewalls of the selection gates SG and the control gates CG. Moreover, when forming the drain regions D, the gate spacers 220 are formed and another ion implantation process may be performed using the gate spacers as ion implanting masks.

An EEPROM according to the present invention will now be described with reference to FIG. 10A and FIG. 10B.

As illustrated in FIG. 10A and FIG. 10B, a plurality of device isolation layers 105 are disposed at a predetermined region of the semiconductor substrate 100 to define active regions A. In addition, a pair of control gates CG and a pair of selection gates SG are disposed over the active region A to cross the device isolation layers 105. The control gates CG and the selection gates SG are made of the same material having the same thicknesses.

According to an embodiment of the present invention, the selection gates SG are interposed between the control gates CG. A drain region D is disposed at an active region A between the control gates CG to act as a drain electrode of an EEPROM. A tunnel impurity region 110 is disposed at an active region A between the control gate CG and the selection gates SG. The tunnel impurity region 110 may extend toward the active region A below the control gate CG. A source region S, acting as a source region of an EEPROM, is interposed between the adjacent control gates CG which cross over the different device isolation layers.

The floating gate FG and the intergate dielectric pattern 192, which are stacked in the order named, are interposed between the control gates CG and the active region A. The floating gate FG, the control gate CG, and the selection gate SG are all made of polysilicon. The intergate dielectric pattern 192 is made of silicon nitride and silicon oxide that are stacked in the order named. Alternatively, the intergate dielectric may be a multiple layer including at least one silicon nitride and at least one silicon oxide. A gate insulation layer is interposed between the selection gates SG and the active region A to constitute a selection transistor.

According to an embodiment of the present invention, a gate insulation layer constituting the selection transistor is a material layer having the same thickness as the intergate dielectric pattern 192. As a result, the gate insulation layer constituting the selection transistor is made of silicon nitride and silicon oxide layer that are stacked in the order named. Alternatively, the gate insulation layer may be a multiple layer including at least one silicon nitride and at least one silicon oxide.

A gate insulation pattern 165 constituting a memory transistor and a tunnel insulation pattern 145 having a smaller thickness than the gate insulation pattern 165 are interposed between the floating gate FG and the active region A. In this case, the tunnel insulation layer 145 is aligned at one side adjacent to the floating gate FG. Namely, the lowest bottom surface of the floating gate FG contacting the tunnel insulation pattern 145 is disposed at the outermost boundary portion of the floating gate FG, as illustrated in FIG. 10A and FIG. 10B.

According to an embodiment of the present invention, an area of the tunnel insulation pattern 145 is minimized to enhance the efficiency of program/erase operations of an EEPROM. For this, a portion of the active region A where the tunnel insulation pattern 145 is disposed has a smaller width than the other portions of the active region A where the selection gates SG passes. In this case, the tunnel insulation pattern 145 is disposed to cross over the active region A, as illustrated in FIG. 10A. According to another embodiment of the present invention, the tunnel insulation pattern 145 may have the same width as the active region A there.

As explained thus far, a tunnel insulation layer and a floating gate are formed using a mold pattern to be self-aligned, enabling the present invention to be applied to fabricate higher-integrated EEPROMs. Since a gate insulation layer of a selection transistor is formed using an intergate dielectric, a process for forming the gate insulation layer of the selection transistor is not needed, i.e., a general process is simplified. Further, the intergate dielectric is made of high-k dielectric including nitride to increase the effective oxide thickness of the select transistor. Therefore, it is possible to fabricate EEPROMs having superior characteristics using a simpler process.

Having described the exemplary embodiments of the present invention it is further noted that it is readily apparent from the foregoing to those skilled in the art that various modifications may be made without departing from the spirit and scope of the invention which is defined by the metes and bounds of the appended claims.

What is claimed is:

1. An EEPROM device comprising:
a device isolation layer disposed at a predetermined region of a semiconductor substrate to define active regions;
a pair of control gates crossing over the device isolation layers and the active regions;
a pair of selection gates interposed between the control gates to cross the device isolation layers and the active regions;
a floating gate and an intergate dielectric pattern stacked between the control gates and the active regions;
a gate insulation layer and a tunnel insulation layer of a memory transistor interposed between the floating gate and the active regions, the tunnel insulation layer being thinner than the gate insulation layer; and
a gate insulation layer of a selection transistor interposed between the selection gates and the active regions,
wherein the tunnel insulation layer is aligned at one side adjacent to the floating gate.

2. The EEPROM as recited in claim 1, wherein the control gates and the selection gates are made of the same material and have the same thickness.

3. The EEPROM as recited in claim 1, wherein the intergate dielectric pattern and the gate insulation layer of the selection transistor are made of the same material and have the same thickness.

4. The EEPROM as recited in claim 3, wherein the intergate dielectric pattern and the gate insulation layer of the selection transistor are multiple layers including at least one silicon oxide and at least one silicon nitride.

5. The EEPROM as recited in claim 3, further comprising:
a plurality of tunnel impurity regions disposed at the active region between the control gate and the selection gates to extend toward a lower portion of the floating gate;
a plurality of drain regions disposed at the active region between the selection gates; and
a source region interposed between the control gates which cross over the device isolation layers.

6. The EEPROM as recited in claim 1, wherein the lowest bottom surface of the floating gate which contacts the tunnel insulation layer is disposed at an outermost boundary portion of the floating gate.

7. The EEPROM as recited in claim 1, wherein a portion of the active regions where the tunnel insulation layer is disposed has a smaller width than other portions of the active regions where the selection gates pass.

* * * * *